United States Patent [19]
Duesman

[11] Patent Number: 5,991,904
[45] Date of Patent: Nov. 23, 1999

[54] METHOD AND APPARATUS FOR RAPIDLY TESTING MEMORY DEVICES

[75] Inventor: Kevin G. Duesman, Boise, Id.

[73] Assignee: Micron Technology, Inc., Boise, Id.

[21] Appl. No.: 08/808,392

[22] Filed: Feb. 28, 1997

[51] Int. Cl.$^6$ .................................................. G11C 29/00
[52] U.S. Cl. .......................... 714/720; 714/719; 365/201; 365/202; 365/189.07; 365/230.04
[58] Field of Search .................................. 371/21.3, 21.2; 365/201, 202, 189.07, 230.04; 714/720, 719

[56] References Cited

U.S. PATENT DOCUMENTS

| | | | |
|---|---|---|---|
| 5,381,368 | 1/1995 | Morgan et al. | 365/189.01 |
| 5,440,517 | 8/1995 | Morgan et al. | 365/202 |

*Primary Examiner*—Andrew Q. Tran
*Attorney, Agent, or Firm*—Seed and Berry LLP

[57] ABSTRACT

A circuit transfers data in an array of memory cells arranged in rows and columns. The circuit includes a plurality of row lines, a plurality of pairs of complementary digit lines, and an array of memory cells, each memory cell having a control terminal coupled to one of the row lines and a data terminal coupled to one of the complementary digit lines of one of the pairs of complementary digit lines responsive to a row enable signal on the row line of the row corresponding to the memory cell. A plurality of sense amplifiers are included in the circuit, each sense amplifier coupled to an associated pair of first and second complementary digit lines which senses a voltage differential between the first and second complementary digit lines and, in response to the sensed voltage differential, drives the first and second complementary digit lines to voltage levels corresponding to complementary logic states. A plurality of equilibration circuits are also included in the circuit, each equilibration circuit coupled between one of the pairs of complementary digit lines and operable to equalize the voltage level on each pair of complementary digit lines to a predetermined level responsive to an equilibration signal. A control circuit is coupled to the plurality of row lines and the equilibration circuits. The control circuit is operable to: write a pattern of data to an initial row of the memory array; generate the equilibrate signal; apply a row enable signal to the row line of the memory cells in the initial row; terminate the row enable signal for the initial row; apply a row enable signal to the row line to which the memory cells in another row are connected; terminate the row enable signal for the another row; and generate the equilibrate signal.

19 Claims, 3 Drawing Sheets

METHOD AND APPARATUS FOR RAPIDLY TESTING MEMORY DEVICES

TECHNICAL FIELD

The present invention relates generally to the testing of memory integrated circuits (IC), and, more specifically, to a method and apparatus for reducing the test time of memory cells in a dynamic random access memory (DRAM).

BACKGROUND OF THE INVENTION

During the manufacture of dynamic random access memories ("DRAMs"), it is necessary to test the DRAM to assure that it is operating properly. Electronic systems containing DRAMs, such as computers, normally test the DRAMs when power is initially applied to the system. A DRAM is typically arranged as an array of individual memory cells. In order to assure that each memory cell is operating properly, prior art test methods write data having a first binary value (e.g., a 1) to all memory cells in the memory array. For a memory array having n rows and m columns of memory cells, it requires nxm bus cycles to write the first binary data values to all the memory cells in the memory array. A bus cycle is the period of time it takes to write or read data to or from an individual memory cell in the DRAM. After having written the first binary data values to the memory cells, this data must be read from the memory cells to assure that each memory cell is operating properly. Once again, this requires nxm bus cycles to read the data having a first binary value. Data having a second binary value (e.g., a 0) is next written to each memory cell in the memory array and is then read from each memory cell to assure each memory cell is operating properly. Each of these read and write operations also requires nxm bus cycles to complete. Therefore, to test each memory cell in the memory array, a total of four times nxm bus cycles is required. In the case of a 16 megabitx4 DRAM, 67,108,864 bus cycles are required to perform a complete test of every memory cell.

To reduce the number of cycles required to test a memory array, various prior art row copy circuits have been developed which simultaneously write data to multiple memory cells. A typical prior art row copy circuit includes a memory array with multiple row access lines, multiple paired digit lines which intersect the row access lines, and a plurality of memory cells coupled at the intersections to form rows of memory cells. The row access lines provide access to associated rows of memory cells and the paired digit lines carry data to and from the accessed memory cells. A sense amplifier is coupled to each pair of digit lines for sensing the data stored by an accessed memory cell and providing that data on the digit lines. The sense amplifier provides the data on the digit lines until an equilibrate control erases the data on the multiple paired digit lines.

The row copy circuit further includes an on-chip circuit that copies data carried by the paired digit lines and stored in a first row of memory cells to at least one other row of memory cells by suspending operation of the equilibrate control to prevent erasure of the data on the paired digit lines. The row copy circuit accesses a first row of memory cells so that the sense amplifiers store the data placed on the digit lines by the accessed first row of memory cells. The row copy circuit then accesses subsequent rows of memory cells to copy the data provided by the sense amplifiers on the digit lines into the other rows of memory cells in the memory array. This circuit thus allows a test pattern of data to be more quickly written to the memory cells of the memory array via the row copy operation. The data written to the memory cells through the row copy operation must be read from the memory cells through a standard read cycle to verify that each memory cell is operating properly.

As will be appreciated by one skilled in the art, the greater the number of bus cycles required to test the memory cells in a DRAM the greater the time and the cost of testing the DRAM. Thus, it is desirable to develop a test system which reduces the number of bus cycles required to test the memory cells of a DRAM.

SUMMARY OF THE INVENTION

A circuit transfers data in an array of memory cells arranged in rows and columns. In one embodiment, the circuit comprises a plurality of row lines, a plurality of pairs of complementary digit lines, and an array of memory cells, each memory cell having a control terminal coupled to one of the row lines and a data terminal coupled to one of the complementary digit lines of one of the pairs of complementary digit lines responsive to a row enable signal on the row line of the row corresponding to the memory cell. A plurality of sense amplifiers are included in the circuit, each sense amplifier coupled to an associated pair of first and second complementary digit lines which senses a voltage differential between the first and second complementary digit lines and, in response to the sensed voltage differential, drives the first and second complementary digit lines to voltage levels corresponding to complementary logic states. A plurality of equilibration circuits are also included in the circuit, each equilibration circuit coupled between one of the pairs of complementary digit lines and operable to equalize the voltage level on each pair of complementary digit lines to a predetermined level responsive to an equilibration signal. A control circuit is coupled to the plurality of row lines and the equilibration circuits. The control circuit is operable to: write a pattern of data to an initial row of the memory array; generate the equilibrate signal; apply a row enable signal to the row line of the memory cells in the initial row; terminate the row enable signal for the initial row; apply a row enable signal to the row line to which the memory cells in another row are connected; terminate the row enable signal for the another row; and generate the equilibrate signal.

DETAILED DESCRIPTION OF THE INVENTION

Figure 1:
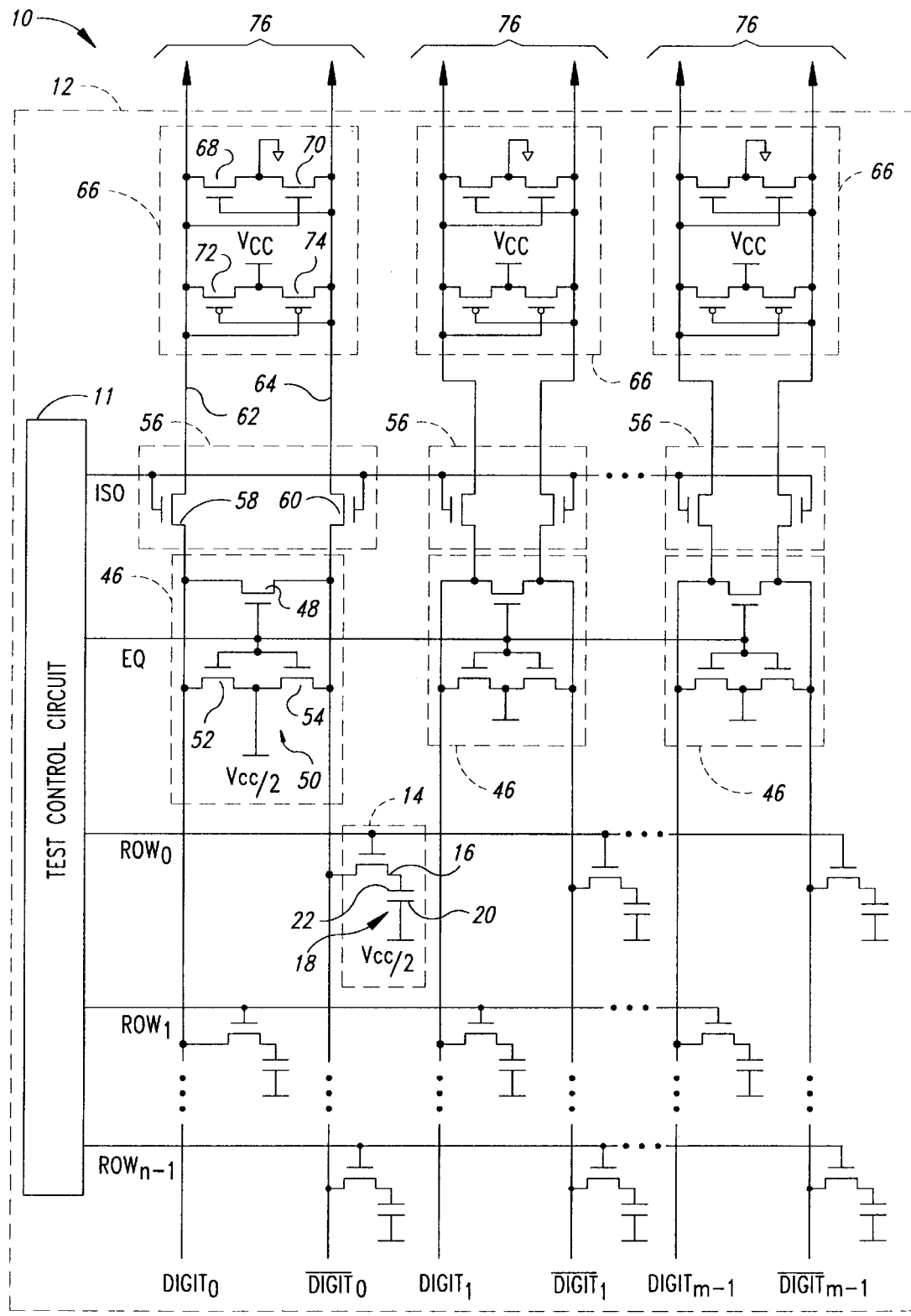
FIG. 1 is a schematic diagram of a memory-cell array of a DRAM including a test control circuit in accordance with one embodiment of the present invention.

FIG. 1 is a schematic block diagram of a DRAM 10 having a memory-cell array 12 which includes a test control circuit 11 in accordance with one embodiment of the present invention. The memory-cell array 12 includes a number of memory cells 14 arranged in rows and columns. Each memory cell 14 includes an access switch in the form of a transistor 16 and a storage element in the form of a capacitor 18. The capacitor 18 includes a first plate 20 coupled to a reference potential, which is typically equal to approximately Vcc/2. A second plate 22 of the capacitor 18 is coupled to the drain of the transistor 16. Each of the memory cells 14 stores a single bit of binary data. The binary data is stored in the memory cells 14 as a voltage across the capacitor 18. A voltage of approximately Vcc at the plate 22 of the capacitor 18 corresponds to a first binary data value, which is typically a 1. Conversely, a voltage of approximately 0 at the plate 22 corresponds to a second binary data value, typically a 0.

The memory cells 14 are arranged in n rows and m columns. One memory cell 14 is positioned at the intersection of each row and column. Every row of memory cells 14 has an associated row line ROW and every column of memory cells has an associated pair of complementary digit lines DIGIT and $\overline{\text{DIGIT}}$. Each memory cell 14 in a given row of memory cells has a control terminal in the form of the gate of the transistor 16 coupled to the associated row line ROW. Each memory cell 14 in a given column of memory cells has a data terminal in the form of the source terminal of the transistor 16 coupled to one of the associated complementary digit lines DIGIT and $\overline{\text{DIGIT}}$. Although the memory-cell array 12 is described as including complementary digit lines DIGIT and $\overline{\text{DIGIT}}$, one skilled in the art will appreciate that the present invention is applicable to other memory structures and not limited to this specific memory structure.

The memory-cell array 12 includes an equilibration circuit 46 coupled between each pair of complementary digit lines DIGIT and $\overline{\text{DIGIT}}$ which operates to equalize the voltage on the associated pair of complementary digit lines. Each equilibration circuit 46 comprises an equilibration transistor 48 and a precharge circuit 50. The equilibration transistor 48 has its drain and source terminals coupled between the complementary digit lines DIGIT and $\overline{\text{DIGIT}}$ and its gate terminal coupled to an equilibration line EQ. The precharge circuit 50 includes a pair of transistors 52 and 54 with the drain terminals of these transistors connected to the complementary digit lines DIGIT and $\overline{\text{DIGIT}}$, respectively. The source terminals of the transistors 52 and 54 are connected to a reference voltage approximately equal to Vcc/2, and the gates of the transistors are coupled to the equilibration line EQ.

In operation, the equilibration circuit 46 equalizes the voltage on the complementary digit lines DIGIT and $\overline{\text{DIGIT}}$ to the same voltage of approximately Vcc/2. To activate the equilibration circuit 46, the equilibration line EQ is driven with a voltage approximately equal to Vcc. In response to this voltage on the equilibration line EQ, the transistors 48, 52 and 54 all are turned ON. The transistors 52 and 54 of the precharge circuit 50 drive the complementary digit lines DIGIT and $\overline{\text{DIGIT}}$ to voltage levels approximately equal to Vcc/2, and the equilibration transistor 48 assures that both the complementary digit lines are at the same voltage level. After the complementary digit lines DIGIT and $\overline{\text{DIGIT}}$ are equilibrated to approximately Vcc/2, the equilibration line EQ is driven to approximately 0 volts to turn OFF the transistors 48, 52 and 54.

The memory-cell array 12 further includes an isolation circuit 56 coupled to each pair of complementary digit lines DIGIT and $\overline{\text{DIGIT}}$. In the embodiment of FIG. 1, each isolation circuit 56 comprises a pair of isolation transistors 58 and 60. The gate terminals of the isolation transistors 58 and 60 are coupled to an isolation line ISO. In operation, the isolation circuits 56 couple a pair of complementary digit lines DIGIT and $\overline{\text{DIGIT}}$ of the memory array to pairs of complementary digit lines 62 and 64, respectively, of associated sense amplifiers 66 when the isolation line ISO is driven with a voltage approximately equal to Vcc to turn ON the isolation transistors 58 and 60.

In the embodiment of FIG. 1, each sense amplifier 66 includes four transistors 68, 70, 72 and 74 connected as shown. The transistors 68 and 70 operate to couple a voltage of approximately zero volts to the digit lines 62 and 64, respectively. Operation of the transistors 68 and 70 is complementary such that when transistor 68 is ON, transistor 70 is OFF, and vice versa. The transistors 72 and 74 operate in the same complementary way to couple a voltage of Vcc to the digit lines 62 and 64, respectively. It should be noted that while the transistors 68 and 70 are shown as being connected directly to ground and transistors 72 and 74 as being connected directly to Vcc, such direct connections are merely for ease of explanation. Typically, a control circuit (not shown) couples the transistors to their respective voltages only when the sense amplifier 66 is to store data from an accessed memory cell 14 and otherwise decouples the transistors from their respective voltages.

Each sense amplifier 66 operates to sense a voltage differential between the complementary digit lines 62 and 64 and, in response to this sensed voltage differential, to drive the complementary digit lines 62 and 64 to voltage levels which correspond to complementary logic states. In other words, the sense amplifiers 66 sense a voltage differential between the complementary digit lines 62 and 64 and drive the complementary digit line having the higher voltage to Vcc and the other complementary digit line to approximately zero volts.

Operation of the sense amplifiers 66 is best understood by way of example. Assume that an equilibration interval has just occurred so that the voltage level on the complementary digit lines is equal to approximately Vcc/2. Further assume that the memory cells 14 coupled to the row line $\text{ROW}_0$ contain data corresponding to a binary 1, which typically means that the voltage at plates 22 of the capacitors 18 is approximately equal to zero volts, i.e., the complement of Vcc representing a logic 1. When the row line $\text{ROW}_0$ is activated (driven to approximately Vcc), the voltage level at the plates 22 of the capacitors 18 is transferred to the complementary digit lines $\overline{\text{DIGIT}}$ which results in the complementary digit lines $\overline{\text{DIGIT}}$ being lowered to a voltage level which is now less than Vcc/2. When the isolation line ISO is activated, the complementary digit lines DIGIT and $\overline{\text{DIGIT}}$ of the array are coupled to the complementary digit lines 62 and 64, respectively, of the sense amplifiers 66. In this instance, the complementary digit lines 62 are at approximately Vcc/2 while the complementary digit lines 64 are lowered to the voltage level less than Vcc/2.

As a result of the complementary digit lines 64 being at a lower voltage level than the complementary digit lines 62, the transistors 68 and 74 are driven OFF while the transistors 70 and 72 are driven ON. When the transistors 68 and 74 are driven all the way OFF, the complementary digit lines 62 are at approximately Vcc and the complementary digit lines 64 are at approximately zero volts. Thus, the voltage level of the digit lines DIGIT corresponds to the binary 1 and the voltage level of the complementary digit lines $\overline{\text{DIGIT}}$ corresponds to the binary 0 voltage stored in the addressed memory cells 14. The data stored in each sense amplifier 66 is provided on a pair of output terminals 76 to read/write circuitry (not shown in FIG. 1).

In normal operation of the DRAM 10, before data is read from the memory cells 14, control circuitry (not shown in FIG. 1) executes an equilibration interval. During the equilibration interval, the control circuitry drives each of the row lines ROW with a voltage approximately equal to zero volts, thereby deactivating each of the memory cells 14. The isolation line ISO is also driven high, thereby turning ON the isolation transistors 58, 60 to couple the complementary digit lines of sense amplifiers 66 to the associated complementary digit lines DIGIT and $\overline{\text{DIGIT}}$ of the array. The equilibration line EQ is then driven by the control circuitry to turn ON the equilibration circuits 46 and equalize the voltage on each complementary digit line DIGIT and $\overline{\text{DIGIT}}$ to approximately Vcc/2. Alternatively, the isolation transistors 26 and 28 can be turned OFF, and the digit lines 62, 64 can be equilibrated by circuitry in the sense amplifier 66 (not shown). Such equilibration of the sense amplifiers 66 is conventional and therefore not described in more detail.

After the equilibration interval, the control circuitry drives the row line ROW of the addressed memory cell 14 with a voltage approximately equal to Vcc to activate each memory cell coupled to the activated row line. The transistor 16 in each activated memory cell 14 is turned ON by Vcc applied to its gate, thereby transferring the voltage at the plate 22 of the capacitor 18 to the complementary digit line DIGIT or $\overline{\text{DIGIT}}$ coupled to the activated memory cell. For example, if the row line $\text{ROW}_0$ is activated, the voltage on the plate 22 of the capacitor 18 in each memory cell 14 in the row is transferred to the complementary digit line $\overline{\text{DIGIT}}$ associated with that cell. The sense amplifiers 66 then compare the voltage on the complementary digit line $\overline{\text{DIGIT}}$ coupled to the activated memory cell 14 to the voltage of Vcc/2 on the other complementary digit line. In response to the sensed voltage differential between the complementary digit lines DIGIT and $\overline{\text{DIGIT}}$, each sense amplifier 66 drives the higher complementary digit line to Vcc and drives the lower complementary digit line to approximately zero volts. The voltage level on the complementary digit lines coupled to the activated memory cells 14 now represents the binary value of the data stored in the activated memory cells. The data contents of the addressed memory cell 14 is then read from the sense amplifier 66 coupled to the column of the addressed memory cell by read/write circuitry (not shown in FIG. 1).

A write operation is substantially different from a read operation because equilibration is not required in a write operation. Instead, complementary data is coupled through read/write data path circuitry (not shown) to respective write driver transistors (not shown) which apply the complementary data to the respective complementary digit lines DIGIT and $\overline{\text{DIGIT}}$. During this time, one of the row lines ROW is driven high, thereby coupling the voltage on one of the complementary digit lines DIGIT or $\overline{\text{DIGIT}}$ to the capacitor 22 in the memory cell 14 located at the intersection of the addressed row and column.

As seen from the description of a conventional read cycle, data from all memory cells 14 in a row which is activated is transferred into the sense amplifiers 66. If the transferred data in all the sense amplifiers 66 could be utilized, one skilled in the art will appreciate that the amount of time required to test each memory cell 14 in the memory-cell array 12 could be reduced. The present invention reduces the test time of a DRAM by utilizing the transferred data stored in all the sense amplifiers 66 to perform transfers of binary data to the memory cells 14 in the array 12.

The memory-cell array 12 is tested under control of the test control circuit 11. The test control circuit 11 operates to provide signals on the isolation line ISO, the equilibration line EQ, and controls activation of all the row lines ROW during testing of the memory-cell array 12. To test the memory-cell array 12, the test control circuit 11 first writes a predetermined test pattern of data to the memory cells 14 coupled to the row line $\text{ROW}_0$. This test pattern of data is written to the memory cells 14 coupled to the row line $\text{ROW}_0$ during standard write cycles as previously described. The test pattern of data written to the memory cells 14 may be varied. For example, either a binary 1 or a binary 0 could be written to and stored in each memory cell 14. Alternatively, an alternating bit pattern could be written to the memory cells 14 so that the cells alternately store binary 1s and 0s (e.g., 1010 . . . ).

After the test control circuit 11 has written and stored the predetermined test pattern of data in the memory cells 14 coupled to the row line $\text{ROW}_0$, the test control circuit performs an equilibrate cycle to equilibrate the complementary digit lines DIGIT and $\overline{\text{DIGIT}}$ in the memory-cell array 12 and the complementary digit lines 62 and 64 in the sense amplifiers 66. Once the equilibration cycle has been completed, the test control circuit 11 activates the row line $\text{ROW}_0$ to provide the data stored in each of the memory cells 14 on the associated pair of complementary digit lines DIGIT and $\overline{\text{DIGIT}}$. The sense amplifiers 66 store the data provided by the accessed memory cells 14 coupled to the row line $\text{ROW}_0$. After the sense amplifiers 66 have stored the data, the test control circuit 11 deactivates the row line $\text{ROW}_0$. At this point, the sense amplifiers 66 retain the stored data and continue to provide this data on the complementary digit lines DIGIT and $\overline{\text{DIGIT}}$. The test control circuit 11 next activates the row line $\text{ROW}_1$ to transfer the data provided by each sense amplifier 66 into the associated memory cells 14 coupled to the row line $\text{ROW}_1$. The test control circuit 11 thereafter deactivates the row line $\text{ROW}_1$ to isolate the memory cells 14 coupled to the row line $\text{ROW}_1$ with each memory cell having stored the associated bit of data.

At this point, the test control circuit 11 has controlled the memory-cell array 12 so that the test pattern data stored in the first row has been copied to the second row. The test control circuit 11 next performs an equilibrate cycle by activating the equilibrate line EQ to equilibrate the complementary digit lines DIGIT and $\overline{\text{DIGIT}}$ in the array 12 and the complementary digit lines 62 and 64 of the sense amplifiers 66. Once the memory-cell array 12 has been equilibrated, the test control circuit 11 activates the row line $\text{ROW}_1$ to store the data stored in the memory cells 14 coupled to the row line $\text{ROW}_1$ in the sense amplifiers 66. The test control circuit 11 repeatedly performs these steps until the test pattern data initially written into the first row of the memory-cell array 12 has been copied into row n−1 of the memory-cell array. Once the test pattern data has been copied to row n−1, the test control circuit 11 performs a standard read operation on each memory cell 14 coupled to the row line $\text{ROW}_{n-1}$ and compares the data read from this row with the data initially written to the first row of the memory-cell array 12.

If each memory cell 14 in the memory-cell array 12 is operating properly, the data read by the test control circuit 11 from row n−1 will be the same as that initially written to the first row. A defective memory cell 14, however, will result in the data read from row n−1 of the memory-cell array 12 being different from that initially written to the first row of the memory-cell array. At this point, the test control circuit 11 may execute a search routine in order to isolate the specific memory cell 14 which is defective. Such a search routine may be, for example, a binary search as known in the art or any other search methodology which may be used to isolate a defective memory cell.

In a typical binary search, the test control circuit 11 would first read data from a row midway through the memory-cell array 12. For example, if there were a thousand row lines in the memory-cell array 12, the test control circuit 11 would perform a standard read of each of the memory cells in row 500 and compare the data read from row 500 to the data initially written to row 0. If the data read from row 500 does not equal that written to row 0, the faulty memory cell 14 lies somewhere between row 0 and row 500. If the data read from row 500 is equal to the data initially written to row 0, the test control circuit 11 knows the defective memory cell 14 is located somewhere between row 501 and row 1000. The test control circuit 11 then selects the group containing the defective memory cell 14 and reads data from a row midway between the two rows defining the group containing the defective memory cell. Depending on whether the data read from this midway row is the same as or different from the data initially written, the control circuit 11 once again selects the group of rows containing the defective memory cell 14. The test control circuit 11 continues this process until it ultimately identifies the row containing the defective memory cell 14. Once the row containing the defective memory cell 14 has been identified, the test control circuit 11 determines the column containing the defective memory cell by simply identifying the cell which contains different binary data than was originally written to that cell.

By identifying defective memory cells 14 in this manner, the test control circuit 11 is able to test the entire memory-cell array 12 faster than prior art systems. The test pattern data need only be written to the first row in the memory-cell array 12 and read from the last row. In contrast, with prior art row copy systems, after the test data pattern is stored all in the memory cells 14 through the row copy operations, this data still has to be read from each memory cell to assure proper operation of the cells. There is no need to do this with the present system because the test pattern of data is propagated through each row of memory cells 14 and not merely written from the sense amplifiers into each row of cells as with a standard row copy system. Thus, each row of memory cells 14 has the test pattern of data both written to it and read from it to comprehensively test the operation of each memory cell.

Figure 2:
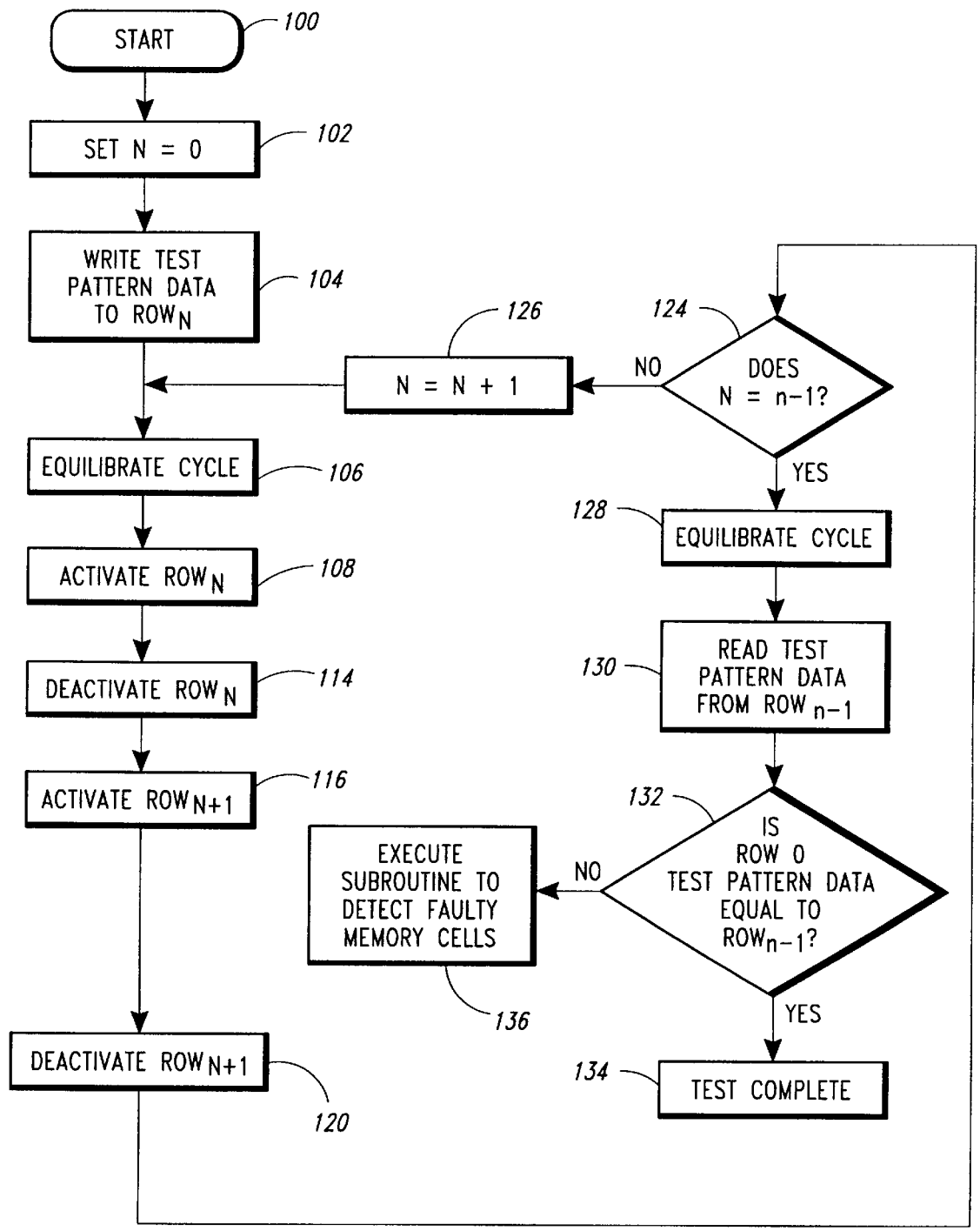
FIG. 2 is a flowchart of the process executed by the test control circuit of FIG. 1.

FIG. 2 is a flowchart showing one embodiment of a test process executed by the test control circuit 11 for testing each memory cell 14 in the memory-cell array 12. The process starts in step 100 and proceeds immediately to step 102. In step 102, the test control circuit 11 sets an index N equal to 0. The index N corresponds to the row of memory cells 14 in the memory-cell array 12 that is currently being accessed under control of the test control circuit 11. From step 102 the process proceeds to step 104.

The first cycle through the process executed by the test control circuit 11, the index N equals 0 in step 104. In this case, the test control circuit 11 writes the test pattern data to the memory cells 14 coupled to the row line $ROW_0$. From step 104, the process proceeds to step 106 and the test control circuit 11 performs an equilibrate cycle on the memory-cell array 12. After the memory-cell array 12 has been equilibrated, the process proceeds to step 108. In step 108, the test control circuit 11 activates the row line $ROW_0$ thereby causing the sense amplifiers 66 for the respective columns to store the data in $ROW_0$ of the array. From step 108, the process proceeds to step 114 where the test control circuit 11 deactivates the row line $ROW_0$. From step 114, the process goes to step 116.

In step 116, the test control circuit 11 activates the row line $ROW_1$ thereby transferring into $ROW_1$ the data previously transferred from $ROW_0$. The process then goes to step 120 where the test control circuit 11 deactivates the row line $ROW_1$ to store the test pattern data in the memory cells 14 coupled to the row line $ROW_1$. The process proceeds from step 120 to step 124. In step 124, the test control circuit 11 determines whether the index N equals n−1, where n is equal to the number of rows in the memory-cell array 12. If the determination in step 124 is negative, the process proceeds to step 126 and the test control circuit 11 sets the index N equal to N+1. From step 126, the process then proceeds back to step 106 and the test control circuit 11 once again executes steps 106 through step 124.

Until the determination in step 124 is positive, the test control circuit 11 continues to execute steps 106 through step 124. As a result, the test pattern data initially written to the memory cells 14 coupled to the row line $ROW_0$ is propagated through the other rows of the memory-cell array 12. When the determination in step 124 is positive, this means that the test control circuit 11 has copied the test pattern data into the memory cells 14 coupled to the last row line $ROW_{n-1}$. Once the determination in step 124 is positive, the process proceeds to step 128.

In step 128, the test control circuit 11 performs an equilibrate cycle on the memory-cell array 12. After this equilibration cycle, the process proceeds to step 130 and the test control circuit 11 performs standard read cycles to read the test pattern data from the memory cells 14 coupled to the last row line $ROW_{n-1}$ of the memory-cell array 12. After step 130, the process goes to step 132. In step 132, the test control circuit 11 compares the test pattern data initially written to the memory cells 14 coupled to the row line $ROW_0$ to the test pattern data read from the memory cells coupled to the last row line $ROW_{n-1}$ and determines if the data in the two rows is equal. If the determination in step 132 is positive, the process proceeds immediately to step 134 and the test mode executed by the test control circuit 11 is complete, meaning that every memory cell 14 in the memory-cell array 12 is operating properly.

When the determination in step 132 is negative, however, the process proceeds to step 136. In step 136, the test control circuit 11 executes a search subroutine to precisely identify the defective memory cell 14. As previously described, such a search subroutine may be, for example, a binary search as known in the art.

In an alternative embodiment of the process executed by the test control circuit 11, the test control circuit writes a first test pattern of data to the memory cells 14 coupled to the row line $ROW_0$ and a second test pattern of data to the memory cells coupled to the row line $ROW_1$. For example, the first test pattern of data may be an alternating bit pattern 101010 . . . with the initial binary 1 being written to the memory cell 14 associated with the complementary digit lines $DIGIT_0$ and $\overline{DIGIT_0}$. The second test pattern of data would then typically be the alternating bit pattern 010101 . . . with the initial binary 0 being written to the memory cell 14 associated with the complementary digit lines $DIGIT_0$ and $\overline{DIGIT_0}$. In this way, a checkerboard pattern is formed and adjacent memory cells 14 store complementary binary data. Other test bit patterns may, of course, be used in this embodiment.

Figure 4:
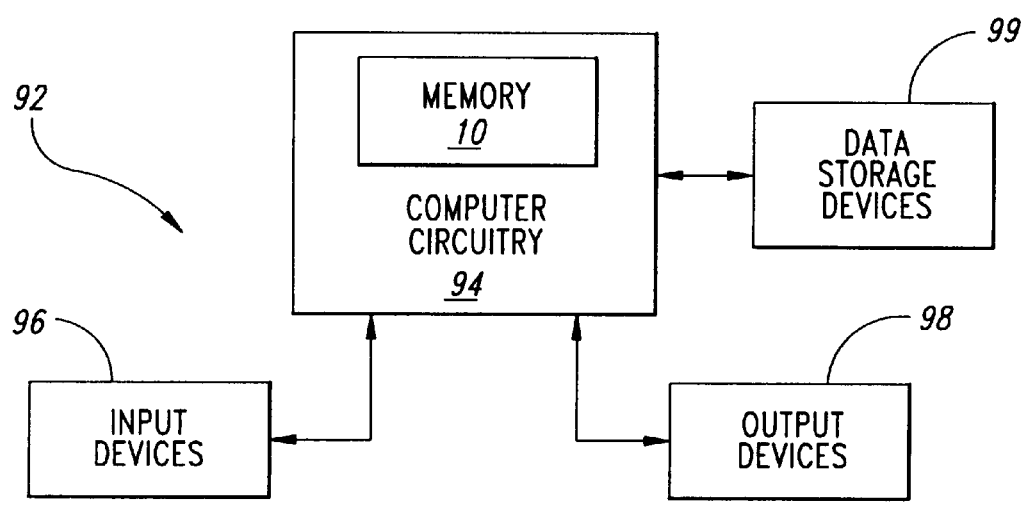
FIG. 4 is a block diagram of a computer system that includes the DRAM of FIG. 3.

With this alternative embodiment, the test control circuit 11 executes a process similar to that shown in FIG. 4 to alternately copy the first test pattern data to the next adjacent even row in the memory-cell array 12 and then copy the second test pattern data to the next adjacent odd row in the memory-cell array. As before, the test control circuit 11 propagates the first and second test patterns of data through the memory-cell array 12 until the first test pattern of data is stored in the last even row of the memory-cell array and the second test pattern of data is stored in the last odd row of the memory-cell array. At this point, the test control circuit 11 reads the first test pattern data from the last even row of the memory-cell array 12 and reads the second test pattern data from the last odd row of the memory-cell array. The test control circuit 11 compares the first test pattern data stored in the last even row with the first test pattern data written to the first row of memory cells 14 coupled to the row line $ROW_0$. If the two test patterns of data are not equal, the test control circuit 11 performs a binary search on the even rows of the memory-cell array 12 to isolate the defective memory cell 14. In the same way, the test control circuit 11 compares the second test pattern data stored in the last odd row with the second test pattern data written to the second row of memory cells 14 coupled to the row line $ROW_1$. If these two test patterns of data are not equal, the test control circuit 11 performs a binary search on the odd rows of the memory-cell array to isolate the defective memory cell 14.

Figure 3:
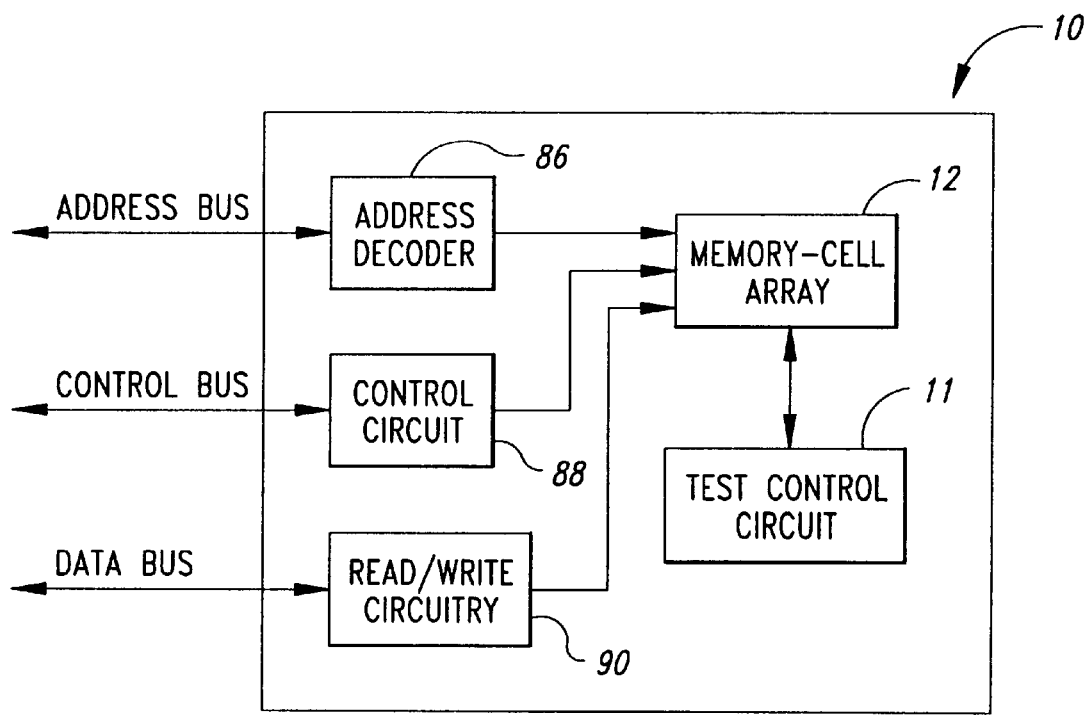
FIG. 3 is a block diagram of a DRAM that includes the memory-cell array and test control circuit of FIG. 1.

FIG. 3 is a block diagram of a DRAM 10 including the memory-cell array 12 and test control circuit 11 of FIG. 1. The test control circuit 11 is shown as coupled to the memory-cell array 12 for controlling the test mode of the memory-cell array as previously described. The memory device 10 further includes an address decoder 86, control circuit 88, and read/write circuitry 90, all of which are conventional and known in the art. The address decoder 86, control circuit 88, and read/write circuitry 90 are all coupled to the memory-cell array 12. In addition, the address decoder 86 is coupled to an address bus, the control circuit 88 is coupled to a control bus, and the read/write circuitry 90 is coupled to a data bus.

In operation, external circuitry provides address, control, and data signals on the respective busses to the memory device 10. During a read cycle, the external circuitry provides a memory address on the address bus and control signals on the control bus to the memory device 10. In response to the memory address on the address bus, the address decoder 86 provides a decoded memory address to the memory-cell array 12 while the control circuit 88 provides control signals to the memory-cell array 12 in response to the control signals on the control bus. The control signals from the control circuit 88 control the memory-cell array 12 so that the memory-cell array provides data to the read/write circuitry 90. The read/write circuitry 90 then provides this data on the data bus for use by the external circuitry. During a write cycle, the external circuitry provides a memory address on the address bus, control signals on the control bus, and data on the data bus. Once again, the address decoder 86 decodes the memory address on the address bus and provides a decoded address to the memory-cell array 12. The read/write circuitry 90 provides the data on the data bus to the memory-cell array 12 and this data is stored in the addressed memory cells in the memory-cell array under control of the control signals from the control circuit 88.

FIG. 4 is a block diagram of a computer system 92 which uses the memory device 10 of FIG. 3. The computer system 92 includes computer circuitry 94 for performing various computing functions, such as executing specific software to perform specific calculations or tasks. In addition, the computer system 92 includes one or more input devices 96, such as a keyboard or a mouse, coupled to the computer circuitry 94 to allow an operator to interface with the computer system. Typically, the computer system 92 also includes one or more output devices 98 coupled to the computer circuitry 94, such output devices typically being a printer or a video terminal. One or more data storage devices 99 are also typically coupled to the computer circuitry 94 to store data or retrieve data from external storage media (not shown). Examples of typical storage devices 99 include hard and floppy disks, tape cassettes, and compact disk read only memories (CD-ROMs). The computer circuitry 94 is typically coupled to the memory device 10 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

I claim:

1. A method for transferring data in a memory-cell array arranged in rows and columns, comprising the steps of:

writing a test pattern of data into an initial row of memory cells;

equilibrating the memory-cell array;

activating the initial row of memory cells thereby transferring data stored in the initial row of memory cells to respective sense amplifiers;

activating a subsequent row of memory cells so the data stored in the sense amplifiers is copied into the memory cells in the subsequent row of memory cells; and repeating the steps of equilibrating the memory-cell array, activating the initial row and activating a subsequent row until data has been stored in a plurality of rows.

2. The method of claim 1 wherein the step of writing a test pattern of data includes the step of writing a test pattern of data into the first row of memory cells in the memory cell array.

3. The method of claim 2 wherein the step of repeating is performed until data has been stored in all the memory cells in the memory cell array.

4. The method of claim 1 wherein the step of writing a test pattern of data writes an alternating bit pattern of data to the initial row of memory cells.

5. The method of claim 4 wherein the alternating bit pattern comprises 1010 . . . with the first binary 1 being written to the memory cell in the first column of the initial row.

6. The method of claim 4 wherein the alternating bit pattern comprises 0101 . . . with the first binary 0 being written to the memory cell in the first column of the initial row.

7. A method for testing memory cells in a memory-cell array arranged in rows and columns, comprising the steps of:

writing a test pattern of data into an initial row of memory cells;

equilibrating the memory-cell array;

activating the initial row of memory cells thereby transferring data stored in the initial row of memory cells to respective sense amplifiers;

activating a subsequent row of memory cells so the data stored in the sense amplifiers is copied into the memory cells in the subsequent row of memory cells;

repeating the steps of equilibrating the memory-cell array, activating the initial row and activating a subsequent row until data has been stored in a plurality of rows;

reading the data that has been stored in one of the rows of memory cells; and comparing the data read from one of the rows of memory cells with the data written to the initial row of memory cells to detect a defective memory cell.

8. The method of claim 7 wherein the step of writing a test pattern of data includes the step of writing a test pattern of data into the first row of memory cells in the memory cell array.

9. The method of claim 8 wherein the step of repeating is performed until data has been stored in all the memory cells in the memory cell array.

10. The method of claim 9 wherein the step of reading the data includes the step of reading the data that has been stored in the last row of memory cells in the memory cell array.

11. The method of claim 10 wherein the step of comparing the data read includes the step of comparing the data read from the last row of memory cells with the data written to the first row of memory cells to detect a defective memory cell.

12. The method of claim 7, further including a step which is executed when the step of comparing the data read detects a defective memory cell in the memory-cell array, the step comprising performing a binary search on the memory-cell array to identify the row containing the defective memory cell.

13. The method of claim 7 wherein the step of writing a test pattern of data includes the step of writing an alternating bit pattern of data to the initial row of memory cells.

14. The method of claim 13 wherein the alternating bit pattern comprises 1010 . . . with the first binary 1 being written to the memory cell in the first column of the initial row.

15. The method of claim 13 wherein the alternating bit pattern comprises 0101 . . . with the first binary 0 being written to the memory cell in the first column of the initial row.

16. A method for testing memory cells in a memory-cell array arranged in rows and columns, comprising the steps of:

writing a test pattern of data into a first even row of memory cells;

writing a test pattern of data into a first odd row of memory cells;

equilibrating the memory-cell array;

activating the first even row of memory cells thereby transferring data stored in the first even row of memory cells to respective sense amplifiers;

activating a subsequent even row of memory cells so the data stored in the sense amplifiers is copied into the memory cells in the subsequent even row of memory cells;

equilibrating the memory-cell array;

activating the first odd row of memory cells thereby transferring data stored in the first odd row of memory cells to respective sense amplifiers;

activating a subsequent odd row of memory cells so the data stored in the sense amplifiers is copied into the memory cells in the subsequent odd row of memory cells;

repeating the steps of equilibrating, activating the first even row, activating a subsequent even row, equilibrating, activating the first odd row and activating a subsequent odd row on successive even and odd rows until data has been stored in the last even and odd rows of the memory-cell array;

reading data from the last even and odd rows of the memory-cell array; and comparing data read from the last even and odd rows against the data written to the first even and odd rows, respectively, to detect a defective memory cell in the memory-cell array.

17. The method of claim 16 wherein the steps of writing a test pattern of data into the first even and odd rows include the step of writing alternating bit patterns of data to the first even and odd rows, respectively.

18. The method of claim 17 wherein the alternating bit pattern written to the first even row comprises 1010 . . . with the first binary 1 being written to the memory cell in the first column of the first even row.

19. The method of claim 18 wherein the alternating bit pattern written to the first odd row comprises 0101 . . . with the first binary 0 being written to the memory cell in the first column of the first odd row.

* * * * *